(12) United States Patent
Liu et al.

(10) Patent No.: US 11,006,063 B2
(45) Date of Patent: May 11, 2021

(54) PIXEL READOUT CIRCUIT, METHOD OF DRIVING THE SAME, AND IMAGE SENSOR

(71) Applicant: BOE TECHNOLOGY GROUP CO., LTD., Beijing (CN)

(72) Inventors: Xiaohui Liu, Beijing (CN); Zhanjie Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 329 days.

(21) Appl. No.: 16/086,432

(22) PCT Filed: Mar. 13, 2018

(86) PCT No.: PCT/CN2018/078776
§ 371 (c)(1),
(2) Date: Sep. 19, 2018

(87) PCT Pub. No.: WO2019/001013
PCT Pub. Date: Jan. 3, 2019

(65) Prior Publication Data
US 2020/0389613 A1    Dec. 10, 2020

(30) Foreign Application Priority Data
Jun. 30, 2017    (CN) .......................... 201710525841.8

(51) Int. Cl.
*H04N 5/378* (2011.01)
*H01L 27/146* (2006.01)
(Continued)

(52) U.S. Cl.
CPC ......... *H04N 5/378* (2013.01); *H01L 27/1461* (2013.01); *H01L 27/14612* (2013.01);
(Continued)

(58) Field of Classification Search
CPC .. H04N 5/378; H04N 5/37457; H04N 5/3741; H04N 5/3698; H01L 27/1461; H01L 27/14612; H01L 27/14658
See application file for complete search history.

(56) References Cited

U.S. PATENT DOCUMENTS 6,587,142 B1 * 7/2003 Kozlowski .............. H03F 3/087
250/208.1
7,773,139 B2 * 8/2010 den Boer ............ H01L 31/0224
348/302
(Continued)

FOREIGN PATENT DOCUMENTS

CN    101515594 A    8/2009
CN    105044955 A    11/2015
(Continued)

OTHER PUBLICATIONS

Second Office Action for Chinese Patent Application No. 201710525841.8 dated Mar. 16, 2020.
(Continued)

*Primary Examiner* — Padma Haliyur
(74) *Attorney, Agent, or Firm* — Calfee, Halter & Griswold LLP

(57) ABSTRACT

A pixel readout circuit including a reset circuit configured to reset a first node to a first power supply voltage in response to a signal on a first scan line being active; a photodetector configured to generate, responsive to incident light, a charge signal and integrate the charge signal, the integrated charge signal causing a change in a voltage level at the first node; a photosensitive circuit configured to generate a pixel current in response to the change in the voltage level at the first node; and a switch circuit configured to transfer the pixel current to a signal readout line for readout in response to a signal on a second scan line being active.

17 Claims, 5 Drawing Sheets

(51) Int. Cl.
  *H04N 5/369* (2011.01)
  *H04N 5/374* (2011.01)
  *H04N 5/3745* (2011.01)
(52) U.S. Cl.
  CPC ..... *H01L 27/14658* (2013.01); *H04N 5/3698* (2013.01); *H04N 5/3741* (2013.01); *H04N 5/37457* (2013.01)

(56) References Cited

U.S. PATENT DOCUMENTS

| | | | |
|---|---|---|---|
| 2004/0174449 A1* | 9/2004 | Lee | H04N 5/374 348/308 |
| 2010/0091162 A1 | 4/2010 | Chuang et al. | |
| 2017/0048475 A1 | 2/2017 | Sakuragl | |
| 2017/0269782 A1 | 9/2017 | Wu | |
| 2018/0226018 A1* | 8/2018 | Han | H01L 27/3244 |

FOREIGN PATENT DOCUMENTS

| | | | |
|---|---|---|---|
| CN | 106534725 A | 3/2017 | |
| CN | 106686328 A | 5/2017 | |

OTHER PUBLICATIONS

Search Report and Written Opinion for International Application No. PCT/CN2018/078776 dated May 23, 2018.

* cited by examiner

PIXEL READOUT CIRCUIT, METHOD OF DRIVING THE SAME, AND IMAGE SENSOR

CROSS-REFERENCE TO RELATED APPLICATIONS

The present application is the U.S. national phase entry of PCT/CN2018/078776, with an international filing date of Mar. 13, 2018, which claims the priority of Chinese Patent Application No. 201710525841.8, filed on Jun. 30, 2017, the entire disclosures of which are incorporated herein by reference.

TECHNICAL FIELD

The present disclosure relates to a pixel readout circuit, a method of driving the pixel readout circuit, and an image sensor including an array of pixel readout circuits.

BACKGROUND

A typical image acquisition device, such as an X-ray imager, includes a plurality of pixels, each of which generates a light response signal and the generated light response signal is readout by a pixel readout circuit. These light response signals are typically so weak that the image acquisition device has to be equipped with an amplifier, such as a charge amplifier, to amplify these light response signals for subsequent processing. This may lead to a complicated structure and therefore a higher cost.

SUMMARY

According to an exemplary embodiment of the present disclosure, a pixel readout circuit is provided comprising: a reset circuit configured to reset a first node to a first power supply voltage in response to a signal on a first scan line being active; a photodetector configured to generate a charge signal in response to incident light and integrate the charge signal, the integrated charge signal causing a change in a voltage level at the first node; a photosensitive circuit configured to generate a pixel current in response to the change in the voltage level at the first node; and a switch circuit configured to transfer the pixel current to a signal readout line for readout in response to a signal on a second scan line being active.

In some exemplary embodiments, the photosensitive circuit comprises a phototransistor having a gate connected to the first node, a first electrode connected to a third signal terminal, and a second electrode connected to the switch circuit, the third signal terminal being for coupling to a third power supply voltage.

In some exemplary embodiments, the phototransistor is a P-type transistor, and the first power supply voltage is a low level voltage.

In some exemplary embodiments, the photodetector comprises: a photodiode connected between the first node and a second signal terminal, the second signal terminal being for coupling to a second power supply voltage; and a capacitor connected in parallel with the photodiode.

In some exemplary embodiments, the reset circuit comprises a first transistor having a gate connected to the first scan line, a first electrode connected to a first signal terminal, and a second electrode connected to the first node. The first signal terminal may be coupled to the first power supply voltage. In some embodiments, the first transistor is a phototransistor having an active layer and a light shield layer covering the active layer to protect the active layer from the incident light. In some embodiments, the first transistor is a P-type transistor.

In some exemplary embodiments, the switch circuit comprises a second transistor having a gate connected to the second scan line, a first electrode connected to the second electrode of the phototransistor, and a second electrode connected to the signal readout line. In some embodiments, the second transistor is a phototransistor having an active layer and a light shield layer covering the active layer to protect the active layer from the incident light. In some embodiments, the second transistor is a P-type transistor.

According to another exemplary embodiment of the present disclosure, a method of driving a pixel readout circuit is provided. The pixel readout circuit comprises a reset circuit, a photodetector, a photosensitive circuit, and a switch circuit. The method comprises: resetting, by the reset circuit at a reset phase, a first node to a first power supply voltage in response to a signal on a first scan line being active; generating, by the photodetector at an integration phase, a charge signal in response to incident light and integrating the charge signal, wherein the integrated charge signal causes a change in a voltage level at the first node; generating, by the photosensitive circuit at a readout phase, a pixel current in response to the change in the voltage level at the first node; and transferring, by the switch circuit at the readout phase, the pixel current to a signal readout line for readout in response to a signal on a second scan line being active.

According to yet another exemplary embodiment of the present disclosure, an image sensor is provided comprising: a plurality of first scan lines configured to transfer first scan signals; a plurality of second scan lines configured to transfer second scan signals; a plurality of signal readout lines configured to transfer pixel currents for readout; and a pixel array comprising a plurality of pixels arranged in an array, each of the pixels comprising: a reset circuit configured to reset a first node to a first power supply voltage in response to the first scan signal on a corresponding one of the plurality of first scan lines being active; a photodetector configured to generate a charge signal in response to incident light and integrate the charge signal, the integrated charge signal causing a change in a voltage level at the first node; a photosensitive circuit configured to generate a pixel current in response to the change in the voltage level at the first node; and a switch circuit configured to transfer the pixel current generated by the phototransistor to a corresponding one of the plurality of signal readout lines for readout in response to the second scan signal on a corresponding one of the plurality of second scan lines being active.

These and other exemplary embodiments of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings, in which.

DETAILED DESCRIPTION

It will be understood that, although the terms first, second, third etc. may be used herein to describe various elements or components, these elements or components should not be limited by these terms. These terms are only used to distinguish one element or component from another. Thus, a first element or component discussed below could be termed a second element or component without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", or "coupled to" another element or layer, it can be directly on, connected, or coupled to the other element or layer, or intervening elements or layers may be present. In contrast, when an element is referred to as being "directly on," "directly connected to", or "directly coupled to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
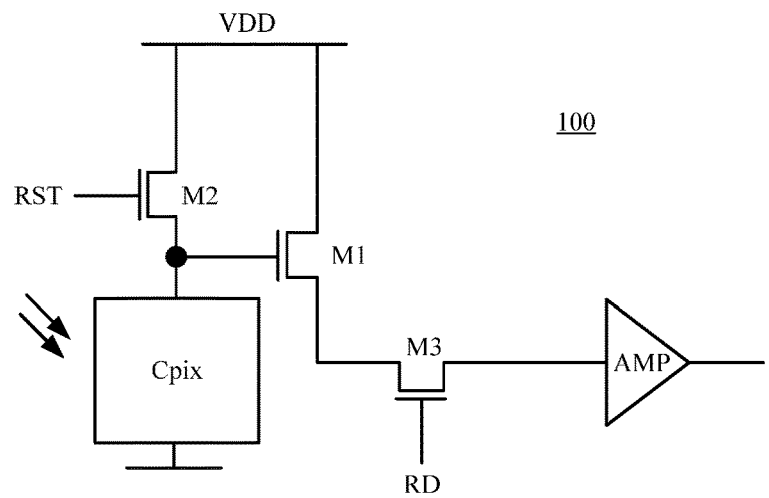
FIG. 1 is a circuit diagram of a typical pixel readout circuit.

FIG. 1 shows a circuit diagram of a typical pixel readout circuit 100. As shown in FIG. 1, the pixel readout circuit 100 includes a photodetector that is sensitive to incident light in a predetermined wavelength range (e.g., X-rays) and is indicated by Cpix, an amplify transistor M1, a reset transistor M2, and a transfer transistor M3. The photodetector Cpix acts as a capacitor that integrates a photo-generated charge signal. The amplify transistor M1, which is illustrated as an n-type field effect transistor, can operate in a saturation region, and the reset transistor M2 and the transfer transistor M3, which are illustrated as n-type field effect transistors, can each operate in an ohmic region.

In operation, the amplify transistor M1 resets the photodetector Cpix in response to a reset signal RST. Under irradiation of the incident light, the photodetector Cpix generates photocarriers that discharge the Cpix, causing a voltage level at the gate of the amplify transistor M1 to decrease by $\Delta V_G$. The amount of decrease $\Delta V_G$ may indicate an intensity of the incident light. The amplify transistor M1 then generates a saturation current (also referred to herein as a pixel current) in response to the decrease amount $\Delta V_G$ of the gate voltage, wherein the amount of change in the pixel current is amplified by a factor $g_m$ (i.e., the transconductance of the amplify transistor M1) with respect to $\Delta V_G$. Therefore, sensing of the incident light can be achieved by detecting the amount of change in the pixel current. However, the pixel current is still so weak that it has to be amplified by means of an amplifier AMP (e.g., a charge amplifier) to enable detection of the pixel current by subsequent processing circuitry.

Figure 2:
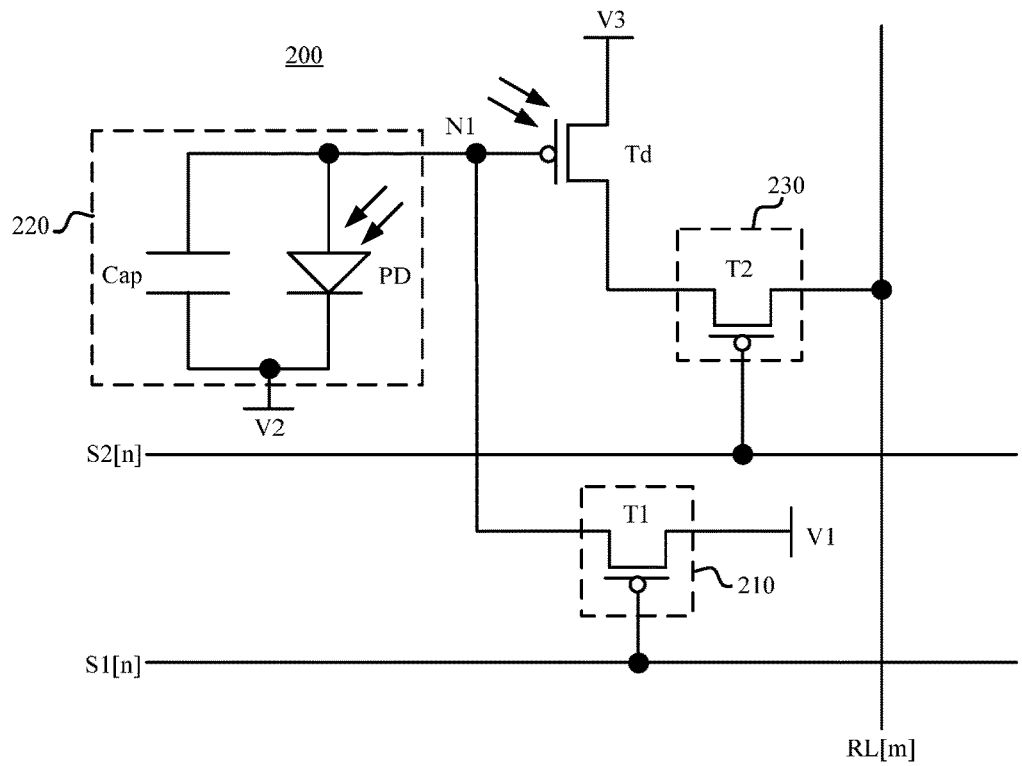
FIG. 2 is a schematic circuit diagram of a pixel readout circuit in accordance with an embodiment of the present disclosure.

FIG. 2 shows a circuit diagram of a pixel readout circuit 200 in accordance with an embodiment of the present disclosure. As shown in FIG. 2, the pixel readout circuit 200 includes a reset circuit 210, a photodetector 220, a photosensitive circuit exemplarily shown as a phototransistor Td, and a switch circuit 230.

The reset circuit 210 is configured to reset a first node N1 to a first power supply voltage in response to a signal on a first scan line S1[n] being active. Specifically, the reset circuit 210 is shown in this embodiment as including a first transistor T1 having a gate connected to the first scan line S1[n], a first electrode connected to a first signal terminal V1, and a second electrode connected to the first node N1. More specifically, in this embodiment, the first transistor T1 is shown as a p-type transistor, and accordingly the first power supply voltage coupled to the first signal terminal V1 is a low level voltage. In the case of a p-type transistor, the phrase "signal being active" means that the signal has a low level.

The photodetector 220 is configured to generate a charge signal in response to the incident light and integrate the charge signal. Specifically, the photodetector 220 is shown in this embodiment as including a photodiode PD connected between the first node N1 and a second signal terminal V2, and a capacitor Cap connected in parallel with the photodiode PD. In an example, the second signal terminal V2 may be coupled to a second power supply voltage having a high level to allow the photodiode PD to be reversely biased. Then, under the irradiation of the incident light, the photodiode PD generates a reverse photocurrent that charges the capacitor Cap. Therefore, the voltage level at the first node N1 is increased by a small signal voltage $\Delta V_G$. It will be understood that photodiode PD is merely exemplary, and that other photosensitive elements, such as a-Se photoconductors, may be used in other embodiments.

The phototransistor Td, illustrated as a p-type transistor, is configured to generate a pixel current in response to a change $\Delta V_G$ in the voltage level at the first node N1 (i.e., the gate of the phototransistor Td). The pixel current can be calculated as follows:

$$I = \frac{1}{2}\mu\varepsilon\frac{W}{L}(V_{GS} - V_{TH})^2$$

where W/L is the channel width to length ratio of the phototransistor Td, $\varepsilon$ is the dielectric constant of the channel insulating layer, $\mu$ is the channel carrier mobility, $V_{TH}$ is the threshold voltage of the phototransistor Td, and $V_{GS}$ is the gate-source voltage of the phototransistor Td. In this example, the first electrode of the phototransistor Td (in this example, the source) is connected to a third signal terminal V3 that may be coupled to a third power supply voltage having a high level, and the second electrode of the phototransistor Td (in this example, the drain) is connected to the switch circuit 230.

Figure 3:
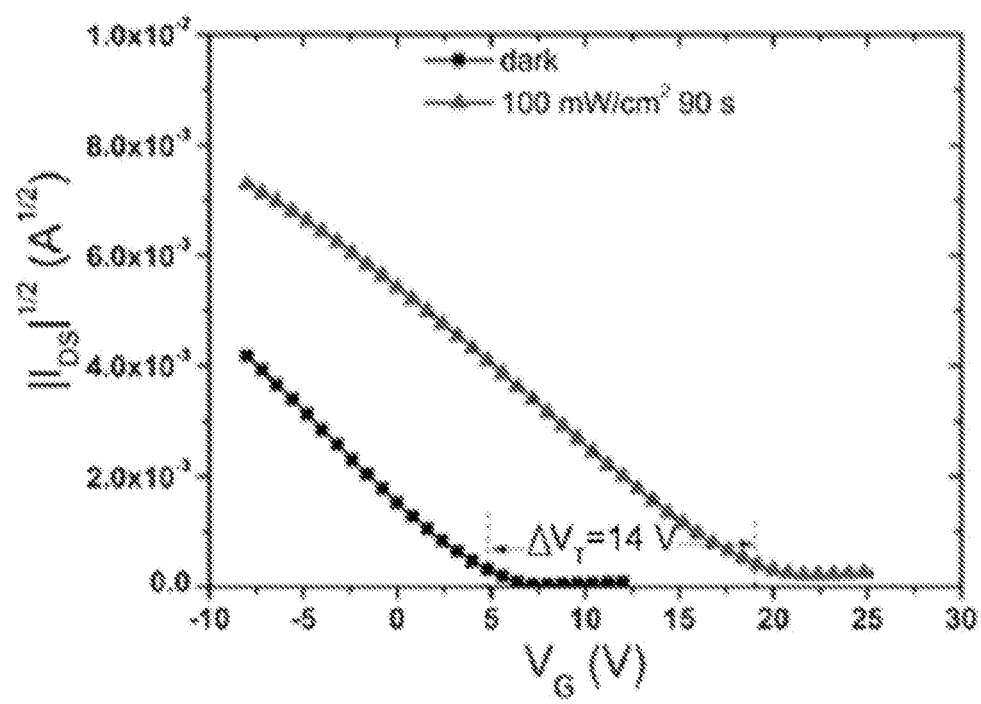
FIG. 3 is a graph showing an I-V characteristic of a typical phototransistor.

The change ΔI in the pixel current I with respect to the change $\Delta V_G$ in the gate voltage is:

$$\Delta I = g_m \cdot \Delta V_G$$

where $g_m$ is the transconductance of the phototransistor Td, which is inversely proportional to the threshold voltage $V_{TH}$ of the phototransistor Td. The phototransistor Td, such as a pentacene thin film transistor, has such sensitivity to visible light that it is subjected to a threshold voltage drift after being irradiated by the visible light. This threshold voltage drift in turn causes an increase in the transconductance $g_m$, thereby providing a larger pixel current and ΔI than in the case where a normal transistor is used as Td. FIG. 3 shows the I-V characteristic curve of a typical pentacene phototransistor, from which it can be seen that after the phototransistor is irradiated by white light of 100 mW/cm$^2$ for 90 seconds, the threshold voltage of the phototransistor drifts up to $\Delta V_T = 14$ V, and thus a much larger drain-source current IDS is obtained for the same gate voltage $V_G$. In other words, the threshold voltage drift of the phototransistor Td advantageously provides an additional gain such that it is possible to directly read out the pixel current I without using an amplifier such as a charge amplifier.

It will be understood that the pentacene transistor is merely exemplary, and that in other embodiments other transistors having similar photosensitive characteristics, such as a WSe2 phototransistor, may be used as the phototransistor Td. Moreover, the photosensitive circuit can take other forms in other embodiments.

The switch circuit 230 is configured to transfer the pixel current I to a signal readout line RL[m] in response to a signal on a second scan line S2[n] being active. Specifically, the switch circuit 230 is illustrated in this embodiment as including a second transistor T2 having a gate connected to the second scan line, a first electrode connected to the second electrode of the phototransistor Td, and a second electrode connected to the signal readout line RL[m]. More specifically, in this embodiment, the second transistor T2 is shown as a p-type transistor. In the case of a p-type transistor, the phrase "signal being active" means that the signal has a low level, as previously mentioned.

Figure 4:
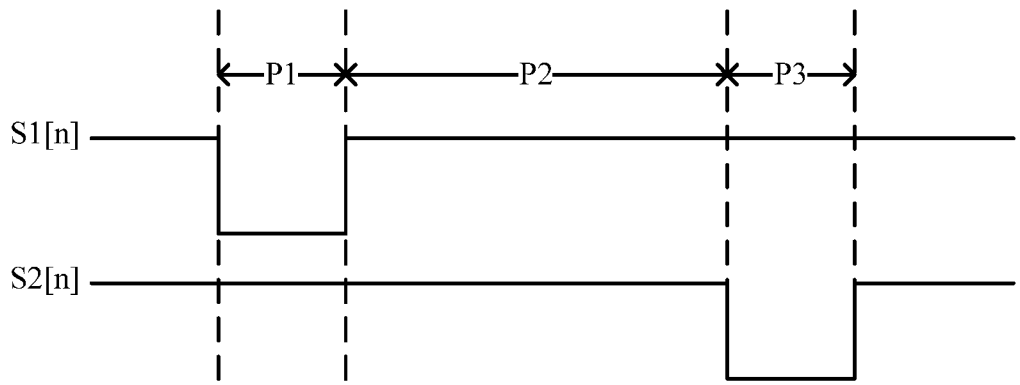
FIG. 4 is a timing diagram for the pixel readout circuit shown in FIG. 2.

FIG. 4 shows a timing diagram for the pixel readout circuit 200 shown in FIG. 2. The pixel readout circuit 200 may operate in three phases.

Figure 5:
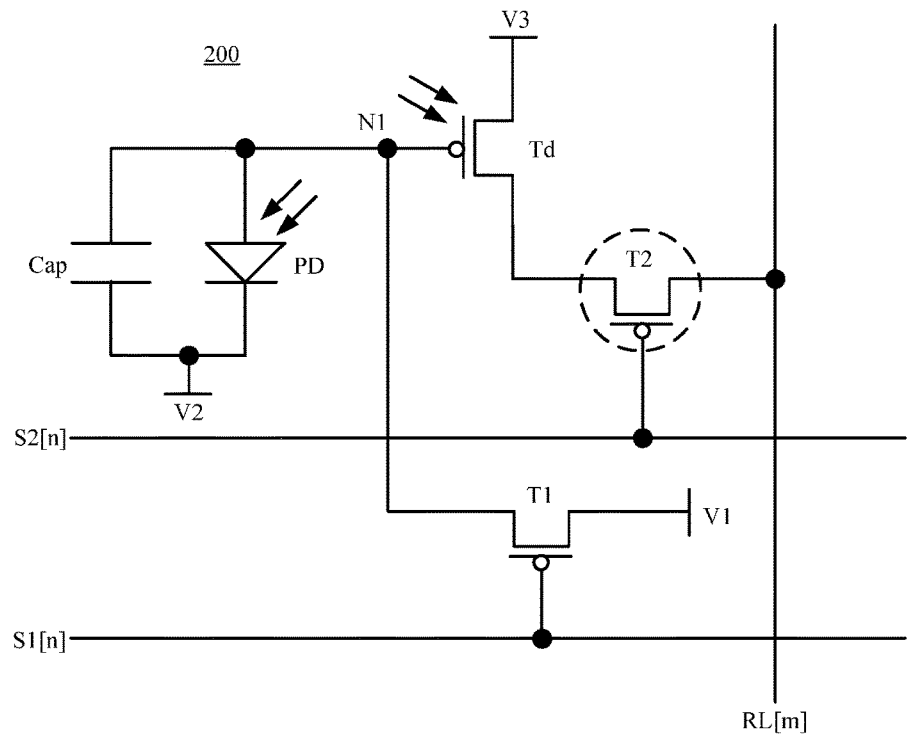
FIGS. 5-7 are equivalent circuit diagrams of the pixel readout circuit shown in FIG. 2 at different operation phases, respectively.

In a reset phase P1, the first scan signal on the first scan line S1[n] is active, and the second scan signal on the second scan line S2[n] is inactive. Therefore, the first transistor T1 is turned on and the second transistor T2 is turned off. An equivalent circuit diagram of the pixel readout circuit 200 is shown in FIG. 5, in which the turned-off second transistor T2 is indicated by a dotted circle. During the phase P1, the first node is reset to a first power supply voltage (in this example, a low level voltage) applied to the first signal terminal V1. This causes the photodiode PD to be in a reversely biased state.

Figure 6:
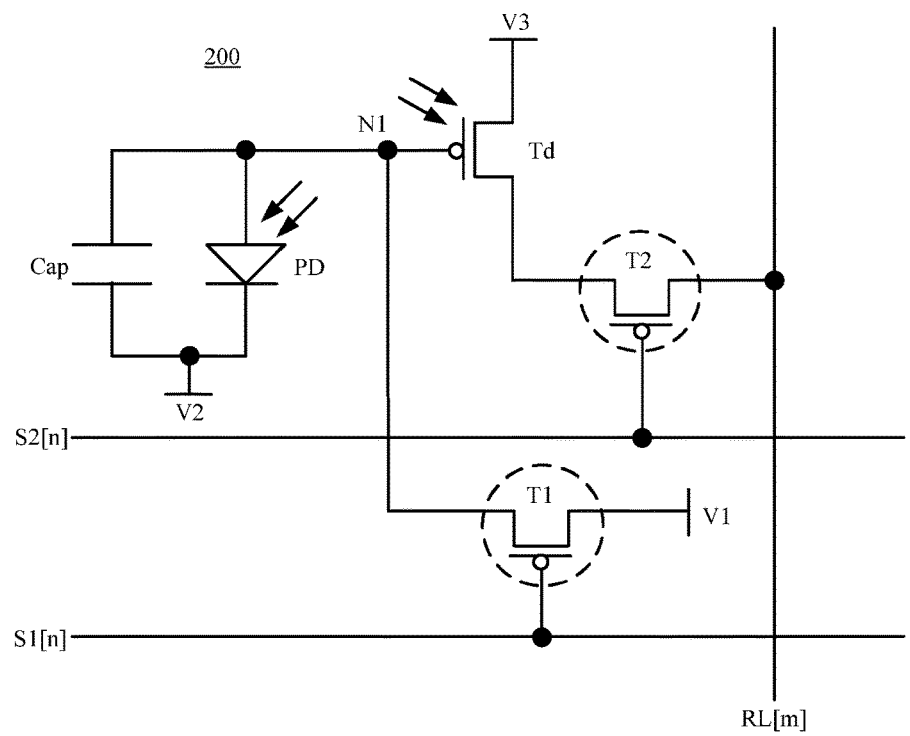

In an integration phase P2, the first scan signal on the first scan line S1[n] and the second scan signal on the second scan line S2[n] are inactive. Therefore, the first and second transistors T1 and T2 are turned off. An equivalent circuit diagram of the pixel readout circuit 200 is shown in FIG. 6, in which the turned-off first and second transistors T1 and T2 are each indicated by a dotted circle. In the reversely biased state, the photodiode PD irradiated by the incident light generates a photocurrent which is integrated by the capacitor Cap, resulting in a small change in the voltage level at the first node N1. Although the phototransistor Td is turned on and operates in the saturation region, no pixel current is generated because there is no current flow path available due to the turned-off second transistor T2. Moreover, the phototransistor Td is also irradiated by the incident light and thus suffers from a threshold voltage drift, as previously described. In a scenario of X-ray detection, the X-rays can be converted by means of a scintillator into visible light having a wavelength of, for example, 300-600 nm, to which the photodiode PD and the phototransistor Td are sensitive.

Figure 7:
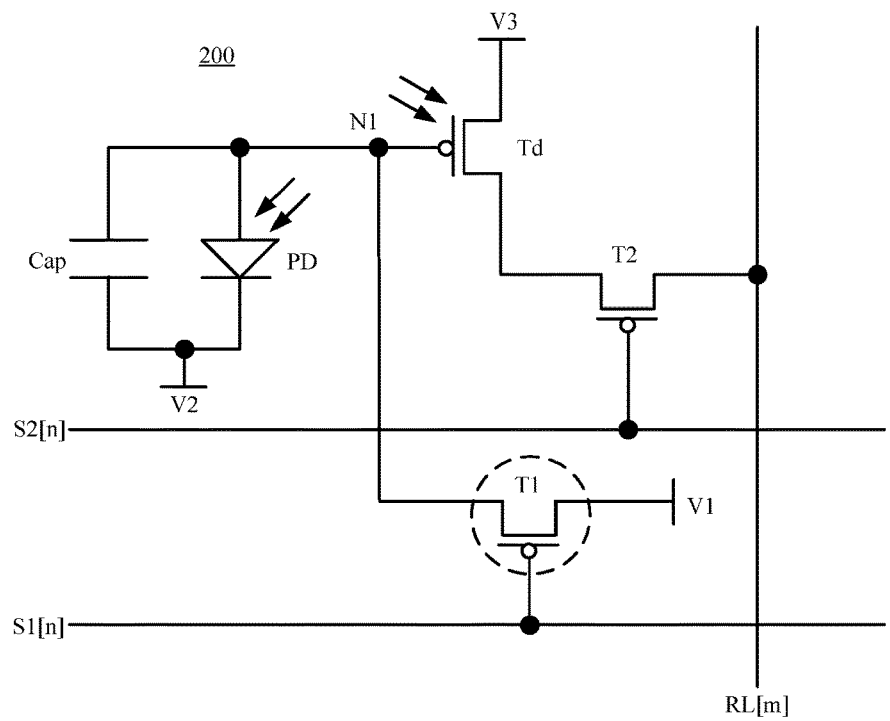

In a readout phase P3, the first scan signal on the first scan line S1[n] is inactive, and the second scan signal on the second scan line S2[n] is active. Therefore, the first transistor T1 is turned off and the second transistor T2 is turned on. An equivalent circuit diagram of the pixel readout circuit 200 is shown in FIG. 7, in which the turned-off first transistor T1 is indicated by a dotted circle. During the phase P3, the pixel current generated by the phototransistor Td is transferred via the second transistor T2 to the signal readout line RL[m], which in turn transfers the pixel current to a subsequent processing circuit (not shown), e.g., a sample and hold circuit, for being picked up. As previously mentioned, the threshold voltage drift of phototransistor Td can provide an additional gain such that the pixel current can be picked up directly by the sample and hold circuit without being amplified by a charge amplifier.

Figure 8:
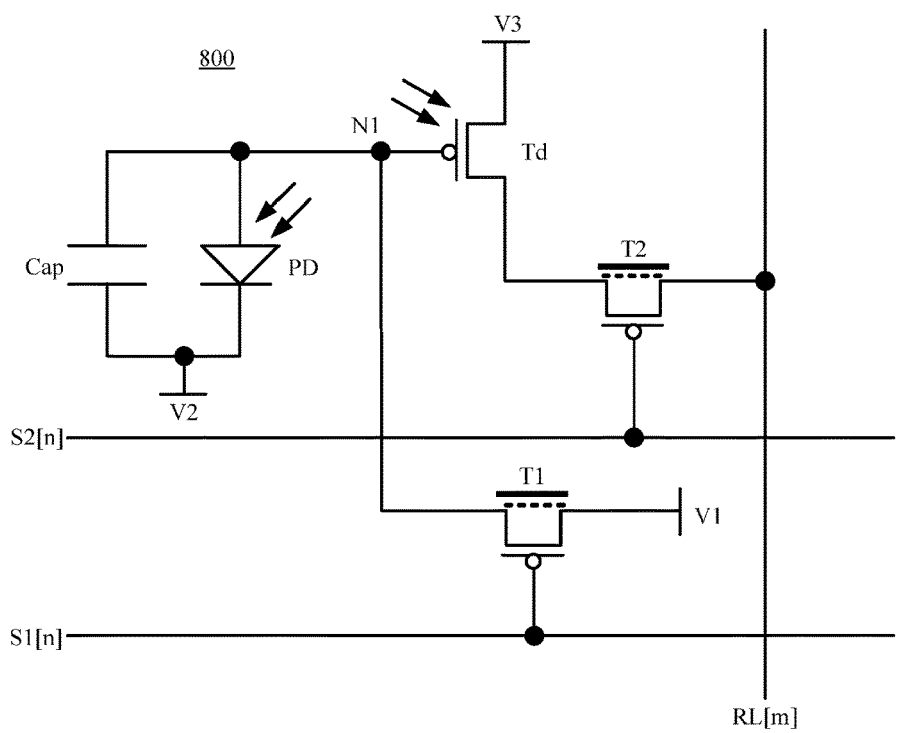
FIG. 8 is a schematic circuit diagram of a pixel readout circuit in accordance with an embodiment of the present disclosure.

FIG. 8 shows a variation 800 of the pixel readout circuit 200 shown in FIG. 2. The same reference numerals in FIG. 8 denote the same elements as in FIG. 2. As shown in FIG. 8, the first and second transistors T1 and T2 each have an active layer indicated by a dotted line. The pixel readout circuit 800 is different from the pixel readout circuit 200 in that the second transistor T2 is also a phototransistor. This allows the phototransistor Td and the second transistor T2 to be fabricated using the same materials and processes, thereby simplifying the process. However, since the second transistor T2 operates in the ohmic region as a switch element, it does not need to be irradiated by the incident light to avoid undesired threshold voltage drift. For this purpose, the second transistor T2 is provided with a light shield layer indicated by a short solid line. The light shield layer may be formed on the active layer to cover the active layer, thereby protecting the active layer from being irradiated by the incident light. Alternatively or additionally, the first transistor T1 may also be a phototransistor and thus also have a light shield layer covering its active layer, as shown in FIG. 8.

Figure 9:
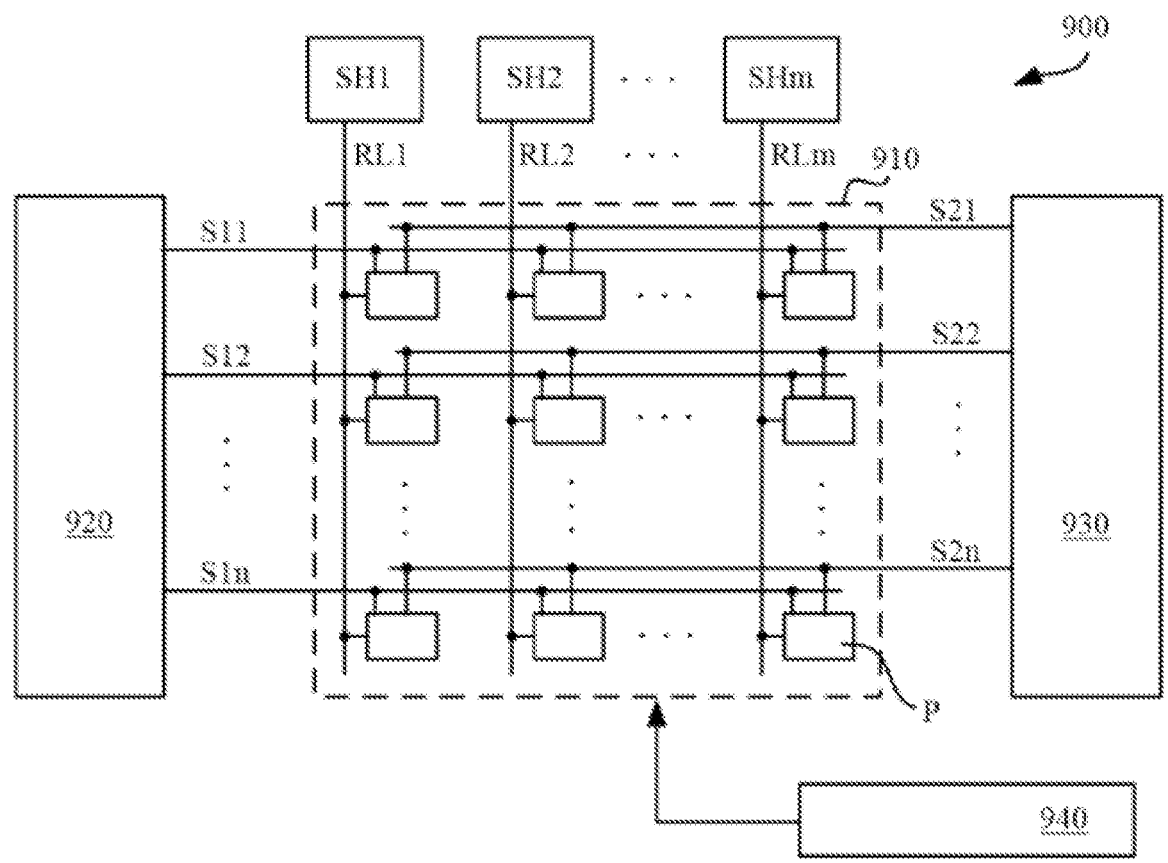
FIG. 9 is a schematic block diagram of an image sensor in accordance with an embodiment of the present disclosure.

FIG. 9 shows a schematic block diagram of an image sensor 900 in accordance with an embodiment of the present disclosure. As shown in FIG. 9, the image sensor 900 includes a plurality of first scan lines S11, S12 . . . S1n, a plurality of second scan lines S21, S22 . . . S2n, a plurality of signal readout lines RL1, RL2 . . . RLm, and a pixel array 910. In another exemplary embodiment, the image sensor 900 also includes a first scan driver 920, a second scan driver 930, a plurality of sample and hold circuits SH1, SH2, . . . , SHm, and a power source 940.

The pixel array 910 includes a plurality of pixels P arranged in an array, each of which may take the form of the pixel readout circuit 200 or 800 described above with respect to FIGS. 4-8 and will not be described in detail here.

The first scan driver 920 is connected to the first scan lines S11, S12 . . . S1n to sequentially supply respective first scan signals to the rows of pixels in the pixel array 910.

The second scan driver 930 is connected to the second scan lines S21, S22 . . . S2n to sequentially supply respective second scan signals to the rows of pixels in the pixel array 910.

The sample and hold circuits SH1, SH2, . . . , SHm are connected to the signal readout lines RL1, RL2, . . . , RLm respectively to sample the pixel currents on the signal readout lines RL1, RL2, . . . , RLm during the readout phase.

The power source 940 supplies a first power supply voltage (e.g., a low level voltage), a second power supply voltage (e.g., a high level voltage), and a third power supply voltage (e.g., a high level voltage) to the respective pixels P in the pixel array 910.

The image sensor 900 can be applied to various image pickup devices. It will be understood that in the scenario of X-ray detection, the image sensor 900 may also include a scintillator (not shown) that converts the X-rays into visible light.

It will also be understood that although transistors T1, T2 and Td are illustrated and described as p-type transistors in the above embodiments, n-type transistors are possible. In the case of an n-type transistor, the active voltage for turning on the transistor is a high level voltage, and the inactive voltage for turning off the transistor is a low level voltage. These transistors are typically fabricated as thin film transistors such that their first and second electrodes can be used interchangeably.

While the disclosure has been illustrated and described in detail in the drawings and foregoing description, such illustration and description are to be considered illustrative or exemplary and not restrictive. The disclosure is not limited to the disclosed embodiments.

What is claimed is:

1. A pixel readout circuit comprising:
   a reset circuit configured to reset a first node to a first power supply voltage in response to a signal on a first scan line being active;
   a photodetector configured to generate a charge signal in response to incident light and integrate the charge signal, the integrated charge signal causing a change in a voltage level at the first node;
   a photosensitive circuit configured to generate a pixel current in response to the change in the voltage level at the first node; and
   a switch circuit configured to transfer the pixel current to a signal readout line for readout in response to a signal on a second scan line being active,
   wherein the photosensitive circuit comprises a phototransistor having a gate connected to the first node, a first electrode connected to a third signal terminal, and a second electrode connected to the switch circuit, the third signal terminal being for coupling to a third power supply voltage.

2. The pixel readout circuit of claim 1, wherein the phototransistor is a P-type transistor, and wherein the first power supply voltage is a low level voltage for turning on the phototransistor.

3. The pixel readout circuit of claim 1, wherein the photodetector comprises:
   a photodiode connected between the first node and a second signal terminal, the second signal terminal being for coupling to a second power supply voltage; and
   a capacitor connected in parallel with the photodiode.

4. The pixel readout circuit of claim 3, wherein the reset circuit comprises a first transistor having a gate connected to the first scan line, a first electrode connected to a first signal terminal, and a second electrode connected to the first node, the first signal terminal being for coupling to the first power supply voltage.

5. The pixel readout circuit of claim 4, wherein the first transistor is a phototransistor having an active layer and a light shield layer covering the active layer to protect the active layer from the incident light.

6. The pixel readout circuit of claim 4, wherein the first transistor is a P-type transistor.

7. The pixel readout circuit of claim 4, wherein the switch circuit comprises a second transistor having a gate connected to the second scan line, a first electrode connected to the second electrode of the phototransistor, and a second electrode connected to the signal readout line.

8. The pixel readout circuit of claim 7, wherein the second transistor is a phototransistor having an active layer and a light shield layer covering the active layer to protect the active layer from the incident light.

9. The pixel readout circuit of claim 7, wherein the second transistor is a P-type transistor.

10. A method of driving a pixel readout circuit, the pixel readout circuit comprising a reset circuit, a photodetector, a photosensitive circuit, and a switch circuit, the photosensitive circuit comprising a phototransistor, the method comprising:
    resetting, by the reset circuit at a reset phase, a first node to a first power supply voltage in response to a signal on a first scan line being active;
    generating, by the photodetector at an integration phase, a charge signal in response to incident light and integrating the charge signal, wherein the integrated charge signal causes a change in a voltage level at the first node;
    generating, by the photosensitive circuit at a readout phase, a pixel current in response to the change in the voltage level at the first node; and
    transferring, by the switch circuit at the readout phase, the pixel current to a signal readout line for readout in response to a signal on a second scan line being active, and
    subjecting the phototransistor to a threshold voltage drift by irradiating the phototransistor while irradiating the photodetector with the incident light.

11. An image sensor comprising:
    a plurality of first scan lines configured to transfer first scan signals;
    a plurality of second scan lines configured to transfer second scan signals;
    a plurality of signal readout lines configured to transfer pixel currents for readout; and
    a pixel array comprising a plurality of pixels arranged in an array, each of the pixels comprising:
       a reset circuit configured to reset a first node to a first power supply voltage in response to the first scan signal on a corresponding one of a plurality of first scan lines being active;
       a photodetector configured to generate a charge signal in response to incident light and integrate the charge signal, the integrated charge signal causing a change in a voltage level at the first node;
       a photosensitive circuit configured to generate a pixel current in response to the change in the voltage level at the first node; and
       a switch circuit configured to transfer the pixel current generated by the photosensitive circuit to a corresponding one of the plurality of signal readout lines for readout in response to a second scan signal on a corresponding one of the plurality of second scan lines being active, wherein the photosensitive circuit comprises a phototransistor having a gate connected to the first node, a first electrode connected to a third signal terminal, and a second electrode connected to the switch circuit, the third signal terminal being for coupling to a third power supply voltage.

12. The image sensor of claim 11, wherein the phototransistor is a P-type transistor, and wherein the first power supply voltage is a low level voltage.

13. The image sensor of claim 11, wherein the photodetector comprises:

a photodiode connected between the first node and a second signal terminal, the second signal terminal being for coupling to a second power supply voltage; and a capacitor connected in parallel with the photodiode.

14. The image sensor of claim 11, wherein the reset circuit comprises a first transistor having a gate connected to the corresponding one of the first scan lines, a first electrode connected to a first signal terminal, and a second electrode connected to the first node, the first signal terminal being for coupling to the first power supply voltage.

15. The image sensor of claim 14, wherein the first transistor is a phototransistor having an active layer and a light shield layer covering the active layer to protect the active layer from the incident light.

16. The image sensor of claim 11, wherein the switch circuit comprises a second transistor having a gate connected to the corresponding one of the second scan lines, a first electrode connected to the photosensitive circuit, and a second electrode connected to the corresponding one of the signal readout lines.

17. The image sensor of claim 16, wherein the second transistor is a phototransistor having an active layer and a light shield layer covering the active layer to protect the active layer from the incident light.

* * * * *